(12) United States Patent
Yamaguchi et al.

(10) Patent No.: US 7,911,117 B2
(45) Date of Patent: Mar. 22, 2011

(54) PIEZOELECTRIC/ELECTROSTRICTIVE BODY, AND PIEZOELECTRIC/ELECTROSTRICTIVE ELEMENT

(75) Inventors: Hirofumi Yamaguchi, Komaki (JP); Shuichi Ozawa, Nagoya (JP)

(73) Assignee: NGK Insulators, Ltd., Nagoya (JP)

( * ) Notice: Subject to any disclaimer, the term of this patent is extended or adjusted under 35 U.S.C. 154(b) by 296 days.

(21) Appl. No.: 12/266,154

(22) Filed: Nov. 6, 2008

(65) Prior Publication Data
US 2009/0121588 A1    May 14, 2009

(30) Foreign Application Priority Data

Nov. 8, 2007  (JP) ................. 2007-291195
Oct. 8, 2008   (JP) ................. 2008-261537

(51) Int. Cl.
*H01L 41/08* (2006.01)
(52) U.S. Cl. ................................... 310/357
(58) Field of Classification Search ........... 310/357–358
See application file for complete search history.

(56) References Cited

U.S. PATENT DOCUMENTS

| 7,625,831 | B2 * | 12/2009 | Kimura et al. | 501/134 |
| 2006/0279178 | A1 | 12/2006 | Ren | |
| 2009/0121374 | A1 * | 5/2009 | Shibata et al. | 264/40.1 |
| 2010/0019624 | A1 * | 1/2010 | Kaigawa et al. | 310/358 |
| 2010/0103226 | A1 * | 4/2010 | Sakashita et al. | 347/68 |
| 2010/0141099 | A1 * | 6/2010 | Suenaga et al. | 310/365 |

FOREIGN PATENT DOCUMENTS

JP    2004-363557 A1   12/2004

* cited by examiner

*Primary Examiner* — J. SanMartin
(74) *Attorney, Agent, or Firm* — Burr & Brown

(57) ABSTRACT

The piezoelectric/electrostrictive body is represented by a composition formula $ABO_3$ (A includes at least one element selected from the group consisting of Li, Na and K, and B includes at least one element selected from the group consisting of Nb, Ta, Sb and Mn), and the body is formed so that a main phase is a tetragonal system, and the orientation degree of a (001) face after a polarization treatment is smaller than that of a (100) face, in a plane vertical to the applying direction of an electric field applied so as to perform the polarization treatment. The present inventive piezoelectric/electrostrictive body has a ratio between a diffraction peak intensity $I_{001}$ of the (001) face and a diffraction peak intensity $I_{100}$ of the (100) face of $I_{001}/I_{100} \leq 1$, in an X-ray diffraction pattern in the same plane after the polarization treatment.

18 Claims, 7 Drawing Sheets

PIEZOELECTRIC/ELECTROSTRICTIVE BODY, AND PIEZOELECTRIC/ELECTROSTRICTIVE ELEMENT

FIELD OF THE INVENTION

The present invention relates to a piezoelectric/electrostrictive body, and a piezoelectric/electrostrictive element.

BACKGROUND OF THE INVENTION

Heretofore, as an element capable of controlling the micro displacement of the order of sub-microns, a piezoelectric/electrostrictive element has been known. Particularly, in the piezoelectric/electrostrictive element, a piezoelectric/electrostrictive portion constituted of a piezoelectric/electrostrictive ceramic composition (hereinafter referred to simply as the "piezoelectric ceramic material") and an electrode portion to which a voltage is applied are laminated on a base body constituted of a ceramic material. The element is suitable for the control of the micro displacement, and has excellent characteristics such as high electromechanical conversion efficiency, high speed response, high durability and saving of power consumption. The piezoelectric/electrostrictive element can be applied to various applications such as a piezoelectric pressure sensor, a probe movement mechanism of a scanning tunnel microscope, a rectilinear propagation guide mechanism in an ultra-precise processing device, a servo valve for hydraulic pressure control, a head of a VTR device, pixels constituting a flat panel type image display device and a head of an ink jet printer.

Moreover, the composition of the piezoelectric ceramic material constituting the piezoelectric/electrostrictive portion has variously been investigated. In recent years, an influence on a global environment, for example, the elution of lead (Pb) due to acid rain tends to be regarded as a problem. Therefore, as a piezoelectric/electrostrictive material in which the influence on the environment is taken into consideration, there has been developed an $(LiNaK)(NbTa)O_3$-based piezoelectric ceramic material capable of providing a piezoelectric body or a piezoelectric element having satisfactory piezoelectric/electrostrictive characteristics without containing any lead (Pb).

The piezoelectric ceramic material is a ferroelectric body and is usually subjected to the polarization treatment to utilize the properties (the piezoelectric characteristics) thereof by incorporating the material in an electronic device or the like. This polarization treatment is a treatment in which a high voltage is applied so as to align the direction of spontaneous polarization in a specific direction, and the treatment is performed by applying the voltage to the piezoelectric ceramic material on appropriate temperature conditions. That is, in the ferroelectric body, a plurality of domains are present owing to charge deviation by the spontaneous polarization, and the piezoelectric ceramic material is subjected to the polarization treatment for aligning the directions of the ferroelectric domains in a predetermined direction, before used.

In addition, a piezoelectric material (the ferroelectric material) is a domain aggregate, and the domains are divided into a 180° domain and a non-180° domain. The 180° domain little contributes to strain, and the non-180° domain noticeably contributes to the strain. This is because the non-180° domain involves the rotation of the domain and hence the volume change of the domain increases. Moreover, during the above polarization treatment, the rotation of the non-180° domain occurs to generate a large strain.

However, the rotation of the non-180° domain, particularly a 90° domain indicating a large volume change has strong irreversibility. Therefore, once the polarization treatment for holding the material at a high voltage is performed, the strain decreases as compared with the strain generated during the polarization treatment. To solve the problem, there has been disclosed a piezoelectric material which produces a huge electrostrictive effect, when the reversibility of the domain rotation is intensified (Document 1: JP-A-2004-363557).

However, according to a manufacturing method of Document 1, an aging treatment requires days (five days to three months). Thus, the method is an inefficient method which incurs the increase of manufacturing cost.

SUMMARY OF THE INVENTION

An object of the present invention is to provide a piezoelectric/electrostrictive body which does not require a long-time treatment such as an aging treatment but in which a strain ratio is increased, and a piezoelectric/electrostrictive element.

To achieve the object, there is provided a piezoelectric/electrostrictive body which is represented by a composition formula $ABO_3$ (A includes one or more elements selected from the group consisting of at least Li, Na and K, and B includes one or more elements selected from the group consisting of at least Nb, Ta, Sb and Mn) and which has a main phase of a tetragonal system, wherein the orientation degree of a (001) face after a polarization treatment is smaller than that of a (100) face, in a plane vertical to the applying direction of an electric field applied so as to perform the polarization treatment. Specifically, according to the present invention, the following piezoelectric/electrostrictive body and piezoelectric/electrostrictive element are provided.

According to a first aspect of the present invention, a piezoelectric/electrostrictive body is provided, which is represented by a composition formula $ABO_3$ (A includes one or more elements selected from the group consisting of at least Li, Na and K, and B includes one or more elements selected from the group consisting of at least Nb, Ta, Sb and Mn) and which has a main phase of a tetragonal system, wherein the orientation degree of a (001) face after a polarization treatment is smaller than that of a (100) face, in a plane vertical to the applying direction of an electric field applied so as to perform the polarization treatment.

According to a second aspect of the present invention, the piezoelectric/electrostrictive body according to the above first aspect is provided, wherein a ratio between a diffraction peak intensity $I_{001}$ of the (001) face and a diffraction peak intensity $I_{100}$ of the (100) face is $I_{001}/I_{100} \leq 1$ in an X-ray diffraction pattern in the plane vertical to the applying direction of the electric field after the polarization treatment.

According to a third aspect of the present invention, the piezoelectric/electrostrictive body according to the above first or second aspects is provided, wherein the piezoelectric/electrostrictive body represented by the composition formula $ABO_3$ includes a mother phase and an additive material phase having a composition different from that of the mother phase.

According to a fourth aspect of the present invention, the piezoelectric/electrostrictive body according to the above third aspect is provided, wherein the mother phase is represented by a composition formula:

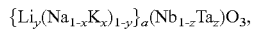

in which $0.90 \leq a \leq 1.20$, $0.20 \leq x \leq 0.80$, $0.02 \leq y \leq 0.20$ and $0.05 \leq z \leq 0.50$.

According to a fifth aspect of the present invention, the piezoelectric/electrostrictive body according to the above third or fourth aspects is provided, wherein the additive material phase is represented by a composition formula:

$$\{Li_y(Na_{1-x}K_x)_{1-y}\}_a(Nb_{1-z-w}Ta_zMn_w)O_3,$$

in which $0.90 \leq a \leq 1.20$, $0.20 \leq x \leq 0.80$, $0.02 \leq y \leq 0.20$, $0.05 \leq z \leq 0.50$ and $0 \leq w \leq 0.03$.

According to a sixth aspect of the present invention, the piezoelectric/electrostrictive body according to the above third aspect is provided, wherein the mother phase is represented by a composition formula:

$$\{Li_y(Na_{1-x}K_x)_{1-y}\}_a(Nb_{1-z}Ta_z)O_3 + nMn \text{ compound},$$

in which $0.90 \leq a \leq 1.20$, $0.20 \leq x \leq 0.80$, $0.02 \leq y \leq 0.20$, $0.05 \leq z \leq 0.50$ and n is 3 molar parts or less in terms of an Mn atom.

According to a seventh aspect of the present invention, the piezoelectric/electrostrictive body according to the above third or sixth aspects is provided, wherein the additive material phase is represented by a composition formula:

$$[\{Li_y(Na_{1-x}K_x)_{1-y}\}_{1-t}Bi_t]_a(Nb_{1-z}Ta_z)O_3 + nMn \text{ compound},$$

in which $0.90 \leq a \leq 1.20$, $0.20 \leq x \leq 0.80$, $0.02 \leq y \leq 0.20$, $0.05 \leq z \leq 0.50$, $0 \leq t \leq 0.002$ and n is 3 molar parts or less in terms of an Mn atom.

According to a eighth aspect of the present invention, a piezoelectric/electrostrictive element is provided which comprises the piezoelectric/electrostrictive body according to any one of the above first to seventh aspects, and an electrode portion provided in the piezoelectric/electrostrictive body.

The piezoelectric/electrostrictive body is constituted so that the body is represented by the composition formula $ABO_3$, the body has a main phase of a tetragonal system, and the orientation degree of the (001) face after a polarization treatment is smaller than that of the (100) face, in the plane vertical to the applying direction of the electric field applied so as to perform the polarization treatment. In consequence, a strain ratio in a case where the electric field is applied after performing the polarization treatment can be increased.

DETAILED DESCRIPTION OF THE INVENTION

An embodiment of the present invention will hereinafter be described with reference to the drawings. The present invention is not limited to the following embodiment, and can be changed, modified or improved without departing from the scope of the invention.

The term "piezoelectric/electrostrictive body" mentioned in the present specification is a piezoelectric/electrostrictive material for use in a piezoelectric/electrostrictive portion, and is a material which exerts specific piezoelectric characteristics, when subjected to a polarization treatment.

The piezoelectric/electrostrictive body of the present invention is represented by a composition formula $ABO_3$ (A includes one or more elements selected from the group consisting of at least Li, Na and K, and B includes one or more elements selected from the group consisting of at least Nb, Ta, Sb and Mn), and the body has a main phase of a tetragonal system. The orientation degree of a (001) face after a polarization treatment is smaller than that of a (100) face, in a plane vertical to the applying direction of an electric field applied so as to perform the polarization treatment. It is to be noted that the main phase is a phase which occupies 50 vol % or more.

Moreover, in the piezoelectric/electrostrictive body of the present invention, a ratio between a diffraction peak intensity $I_{001}$ of the (001) face and a diffraction peak intensity $I_{100}$ of the (100) face is $I_{001}/I_{100} \leq 1$, in an X-ray diffraction pattern in the plane vertical to the applying direction of the electric field after the polarization treatment.

Figure 7:
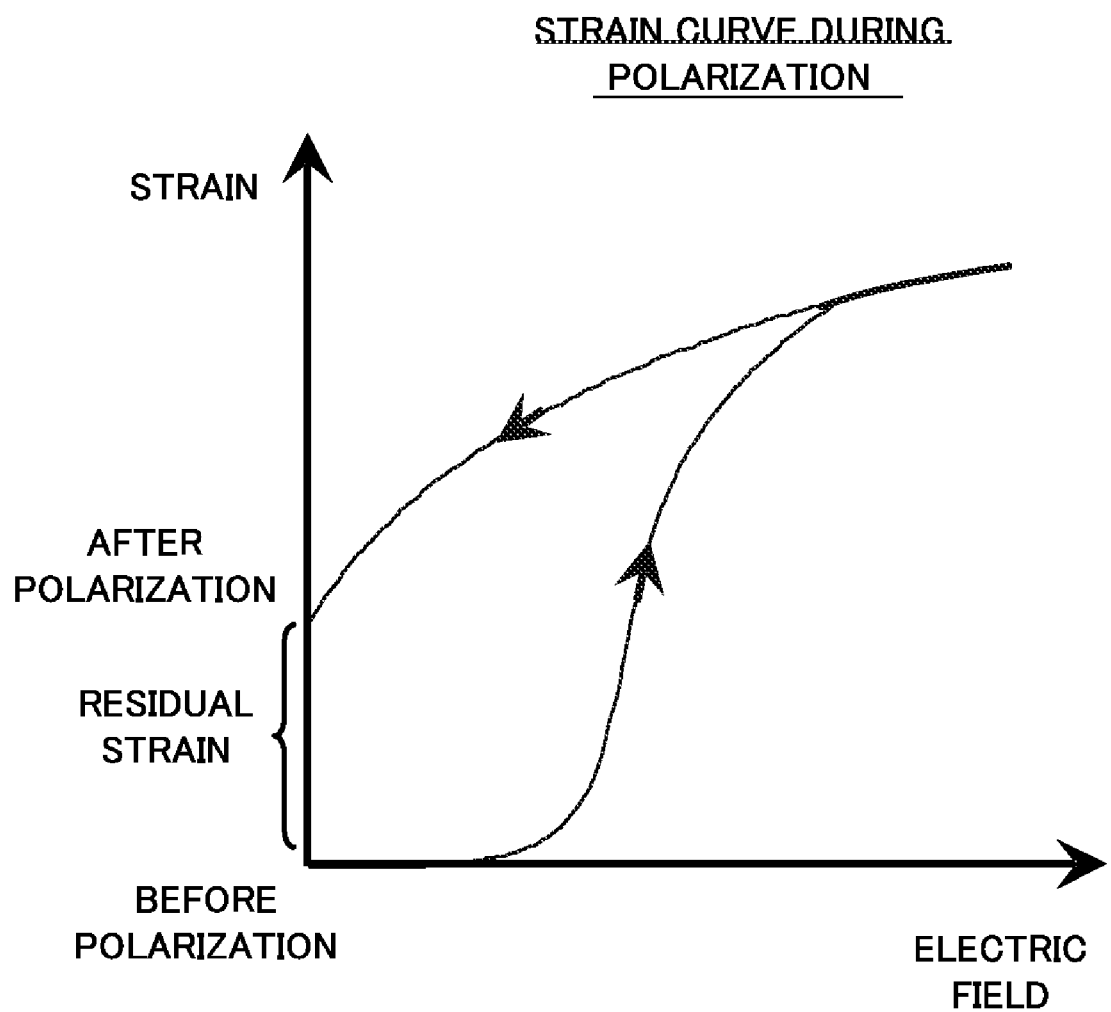
FIG. 7 is a diagram showing a strain curve for explaining a residual strain.

Specifically, a phase different from a mother material is dispersed in the mother material, and the material is polarized to introduce a stress into crystals. That is, the piezoelectric/electrostrictive body of the present invention may be formed in a state in which the mother material and the additive material are mixed. In a case where an additive material phase is formed so that the residual strain of the phase is different from that of a mother phase, excellent piezoelectric characteristics (large strain characteristics) are exerted. Specifically, a material having the residual strain during the polarization larger than that of the mother material may be selected as the additive material. Here, the residual strain indicates the strain amount during the polarization. When the strain amount before the polarization treatment is an origin as shown in FIG. 7, the residual strain is a value of the strain amount after the polarization treatment (an amount in a case where the change of the length of a sample before the polarization treatment and after the polarization treatment (before the applying of the electric field and after the applying) is represented by the change amount of the length).

Since the additive material phase may have the residual strain different from that of the mother phase, a composition may be different from that of the mother phase. Specifically, the additive material may be a material of a composition system completely different from that of the mother material. The composition may be, for example, a composition in which Mn is added to the mother material (a part of the mother material is replaced with Mn) as in Example 1 described later. Even in any composition system, the material having the residual strain after the polarization treatment which is larger than the residual strain of the mother material is selected, whereby the improvement of the strain ratio is expected.

Furthermore, in a micro structure after firing, the additive material preferably has crystal grains larger than those of the mother material. That is, the structure may be a bimodal structure in which the additive material having large crystal grains is dispersed in the mother material having small crystal grains. The large crystal grains have less grain boundaries as compared with the small crystal grains in a case where the particles having an equal volume are compared, and hence it is supposed that the additive material has a large residual strain during the polarization.

That is, the additive material phase indicates a (large) residual strain different from that of the mother phase, and has crystals represented by the composition formula $ABO_3$ (A includes one or more elements selected from the group consisting of at least Li, Na and K, and B includes one or more elements selected from the group consisting of at least Nb, Ta, Sb and Mn)). The additive material phase preferably has a composition different from that of the mother phase, and may have particle diameters different from those of the mother phase. Moreover, in the piezoelectric/electrostrictive body of the present invention, in a use temperature region, the main phases of the mother phase and the additive material phase are both tetragonal systems.

The piezoelectric/electrostrictive body of the present invention is a ceramic material in which the crystal structure of the mother phase formed by the mother material is capable of reversibly phase-transiting to a cubic system, a tetragonal system and an orthorhombic system via phase transition points. More specifically, the mother phase is the cubic system on high-temperature conditions. When the temperature lowers, the mother phase changes from the cubic system to the tetragonal system at a first phase transition point. When the temperature still lowers, the tetragonal system phase-transits to the orthorhombic system at a second phase transition point.

Moreover, the crystal structure of the additive material phase formed by the additive material is also a ceramic material capable of reversibly phase-transiting to the cubic system, the tetragonal system and the orthorhombic system via the phase transition points as in the above mother material. Moreover, in a use temperature region where the material is used as a piezoelectric/electrostrictive material, the main phases of the mother phase and the additive material phase are both tetragonal systems. When the use temperature region is in a range of, for example, −20° C. or more and 80° C. or less, the mother material and the additive material having the crystal structure of the main phase of the tetragonal system in this range is selected. Moreover, when the use temperature region is in a range of, for example, 50° C. or more and 150° C. or less, the mother material and the additive material having the crystal structure of the main phase of the tetragonal system in this range is selected.

In a piezoelectric/electrostrictive portion constituting a piezoelectric/electrostrictive element described later, this piezoelectric/electrostrictive body is formed by a polarization treatment in which an electric field (a voltage) is applied in a temperature region lower than the first phase transition point at which the mother phase of the crystal structure changes from the cubic system to the tetragonal system. The piezoelectric/electrostrictive body of the present invention or the piezoelectric/electrostrictive portion of the piezoelectric/electrostrictive element is formed in a state in which the mother material includes the additive material and has the mother phase and the additive material phase, and is subjected to the polarization treatment by applying the voltage, so that excellent piezoelectric characteristics are exerted.

As described above, in the piezoelectric/electrostrictive body of the present invention, the mother phase has the crystal structure of the cubic phase at a temperature higher than the first phase transition point, and the mother phase has the crystal structure of the tetragonal system and causes spontaneous polarization in the use temperature region at a temperature lower than the first phase transition point. Specifically, the mother phase is the piezoelectric/electrostrictive body represented by the composition formula $ABO_3$ (A includes one or more elements selected from the group consisting of at least Li, Na and K, and B includes one or more elements selected from the group consisting of at least Nb, Ta and Sb). The main phase of the piezoelectric/electrostrictive body of the present invention is the tetragonal system. The mother phase includes, as the additive material phase, the piezoelectric/electrostrictive body represented by a composition formula $ABO_3$ (A includes one or more elements selected from the group consisting of Li, Na and K, and B includes one or more elements selected from the group consisting of Nb, Ta, Sb and Mn) and constituted of the mother phase of the tetragonal system.

More specifically, the mother phase is, for example, an alkali niobate-based ferroelectric body represented by the following composition formula (1):

in which $0.90 \leq a \leq 1.20$, $0.20 \leq x \leq 0.80$, $0.02 \leq y \leq 0.20$ and $0.05 \leq z \leq 0.50$.

It is to be noted that the range of a of the composition formula (1) is preferably $1.00 < a \leq 1.20$, more preferably $1.00 < a \leq 1.10$.

It is to be noted that when the composition of the mother phase is represented by the composition formula (1) a site B (a site containing Nb and Ta as constituting metal elements) in this composition formula (1) may further contain a transition metal element other than Nb and Ta. Examples of the transition metal element other than Nb and Ta include V, W, Cu, Ni, Co, Fe, Mn, Cr, Ti, Zr, Mo and Zn. Moreover, when the composition of the mother phase is represented by the above composition formula (1), a site A (a site containing Li, Na and K as the constituting metal elements) in this composition formula (1) may further contain an element other than Li, Na and K. Examples of the element other than Li, Na and K include Ag, La, Ba, Ca, Sr, Pb and Bi. These elements may be contained as an oxide and the like in grains or a grain boundary.

Furthermore, when the composition of the mother phase is represented by the above composition formula (1) this composition formula (1) preferably further includes Sb, so that a piezoelectric/electrostrictive element having a large amount of strain to be generated and having further excellent piezoelectric characteristics can be manufactured.

Moreover, examples of the additive material phase included in the mother phase include $BaTiO_3$, PZT, $PbTiO_3$, and $(Bi_{0.5}, Na_{0.5})TiO_3$. Further specifically, the examples include a phase represented by the following composition formula (2):

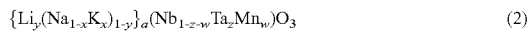

in which $0.90 \leq a \leq 1.20$, $0.20 \leq x \leq 0.80$, $0.02 \leq y \leq 0.20$, $0.05 \leq z \leq 0.50$ and $0 \leq w \leq 0.03$.

It is to be noted that when the composition of the additive material phase is represented by the above composition formula (2), a site B (a site containing Nb and Ta as constituting metal elements) in this composition formula (2) may further contain a transition metal element other than Nb and Ta in the same manner as in the mother phase. Examples of the transition metal element other than Nb and Ta include, in addition to Mn of the composition formula (2), V, W, Cu, Ni, Co, Fe, Cr, Ti, Zr, Mo and Zn. Moreover, when the composition of the additive material phase is represented by the above composition formula (2) a site A (a site containing Li, Na and K as the constituting metal elements) in this composition formula (2) may further contain an element other than Li, Na and K. Examples of the element other than Li, Na and K include Ag, La, Ba, Ca, Sr, Pb and Bi. These elements may be contained as an oxide and the like in grains or a grain boundary.

Furthermore, when the composition of the additive material phase is represented by the above composition formula (2), this composition formula (2) preferably further includes Sb, so that the piezoelectric/electrostrictive element having the large amount of strain to be generated and having further excellent piezoelectric characteristics can be manufactured.

Moreover, examples of the mother phase include a mother phase represented by the following composition formula (3) of an Mn added composition.

Composition formula:

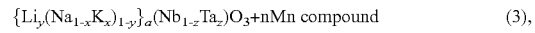

$$\{Li_y(Na_{1-x}K_x)_{1-y}\}_a(Nb_{1-z}Ta_z)O_3 + nMn \text{ compound} \qquad (3),$$

in which $0.90 \leq a \leq 1.20$, $0.20 \leq x \leq 0.80$, $0.02 \leq y \leq 0.20$, $0.05 \leq z \leq 0.50$ and n is 3 molar parts or less in terms of an Mn atom.

Examples of the additive material phase included in the mother phase of the Mn added composition represented by the above composition formula (3) include a phase represented by the following composition formula (4) of the Mn added composition and Bi replacing composition.

Composition formula:

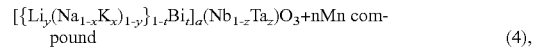

$$[\{Li_y(Na_{1-x}K_x)_{1-y}\}_{1-t}Bi_t]_a(Nb_{1-z}Ta_z)O_3 + nMn \text{ compound} \qquad (4),$$

in which $0.90 \leq a \leq 1.20$, $0.20 \leq x \leq 0.80$, $0.02 \leq y \leq 0.20$, $0.05 \leq z \leq 0.50$, $0 \leq t \leq 0.002$ and n is 3 molar parts or less in terms of an Mn atom.

In the piezoelectric/electrostrictive body in which the mother phase of the Mn added composition is combined with the additive material phase of the Mn added composition and Bi replacing composition, the mother phase has a high strain ratio composition, and the mother phase has a further large residual strain difference. For these two reasons, a strain ratio improvement effect further increases.

The appropriate amount of the additive material to be added in a volume ratio is in a range of 5 vol % or more and 45 vol % or less, preferably 20 vol % or more and 45 vol % or less, more preferably 35 vol % or more and 45 vol % or less. It is to be noted that in the present specification, the volume ratio of the additive material is the ratio of the additive material occupying the volume of the piezoelectric/electrostrictive body in which the mother material and the additive material are mixed (e.g., when 5 vol % of the additive material is contained, 95 vol % of the mother material is contained).

To manufacture the piezoelectric/electrostrictive body for use in forming the piezoelectric/electrostrictive portion of the piezoelectric/electrostrictive element, first mother material powder and additive material powder are individually manufactured. To satisfy the ratio (the molar ratio) of each metal element in the composition of the material powder, a compound containing each metal element is weighed, and mixed with a solvent such as ethanol by a mixing method such as ball milling to obtain a mixed slurry. It is to be noted that there is not any special restriction on the type of the compound containing each metal element, but the oxide, carbonate or the like of each metal element is preferably used. For example, lithium carbonate, potassium tartrate, sodium tartrate, niobium oxide or tantalum oxide may be used.

The resultant mixed slurry can be dried by using a drier or performing an operation such as filtering, to obtain the mixed material. The resultant mixed material is calcined, and crushed if necessary. Thus, the mother material powder and the additive material powder are individually manufactured.

The calcined and crushed additive material powder and mother material powder preferably have an average particle diameter of 0.1 μm or more and 1 μm or less. Here, the average particle diameter is a 50% diameter (a median diameter) in a cumulative distribution.

The calcined and crushed additive material powder is fired at 1000° C. or more to grow grains, and then crushed to obtain an average particle diameter of 0.5 μm or more and 10 μm or less by a classifier. When the average particle diameter of the additive material powder is set to an average particle diameter larger than 10 μm, strain characteristics noticeably fluctuates, and it is difficult to obtain stable strain characteristics.

When the average particle diameter of the additive material powder is set to an average particle diameter smaller than 0.5 μm, a large effect of increasing the strain ratio is not easily obtained. This is supposedly because when the powder has excessively small particle diameters, the powder reacts with (is solved in) the mother material to form a homogeneous piezoelectric/electrostrictive body (a homogeneous crystal phase or composition). Moreover, when the fired additive material has excessively small crystal grain particles, a domain wall is disposed only in one direction, and the strain of the additive material during the polarization treatment has anisotropy. Consequently, it is supposed that a non-uniform residual stress is present in an applied electric field direction. In other words, the piezoelectric/electrostrictive body preferably has a composite structure where the additive material phase different from the mother material crystal phase is present, and the crystal grain diameters of the additive material preferably have the domain walls in a plurality of directions. When the additive material powder having the domain wall only in one direction is used, the powder is preferably oriented and added to mother material particles so that the residual stress is present in a similar uniform direction. Moreover, the average particle diameter of the additive material powder is preferably larger than that of the mother material powder.

The additive material powder in a range of 5 vol % or more and 45 vol % or less is added to the mother material powder, and is dry-mixed using a ball mill. After forming a formed article of the resultant mixed powder, the formed article is fired at a temperature of 950 to 1200° C. to enlarge the average particle diameter of the mother material (the mother phase) to a range of 0.5 to 15 μm, thereby obtaining the piezoelectric/electrostrictive body. It is to be noted that the material powder may be calcined at a temperature of about 600 to 1000° C. Moreover, the material may be crushed by a method such as the ball milling. Next, the resultant piezoelectric/electrostrictive body is processed into an appropriate shape (e.g., a square-plate-like shape) if necessary, and then thermally treated at a temperature of about 400 to 900° C. for one hour or more. Afterward, the polarization treatment is performed, and the piezoelectric/electrostrictive body is used. In the polarization treatment, a voltage of about 5 kV/mm is applied to the piezoelectric/electrostrictive body for 15 minutes or more.

It is to be noted that the piezoelectric/electrostrictive portion and electrodes constituting the piezoelectric/electrostrictive element of the present embodiment may have any shape. Specific examples of the shape include a block-like shape (a so-called bulk shape) and a sheet-like (film-like) shape.

As described above, the piezoelectric/electrostrictive body represented by the composition formula $ABO_3$ can be manufactured and subjected to the polarization treatment to obtain the piezoelectric/electrostrictive body in which the orientation degree of a (001) face after the polarization treatment is smaller than that of a (100) face, in a plane vertical to the applying direction of an electric field applied so as to perform the polarization treatment. In a case where the piezoelectric/ electrostrictive body is manufactured in this manner so that the orientation degree of the (001) face is smaller than that of the (100) face, the strain ratio of the piezoelectric/electrostrictive body can be increased.

Specifically, for example, the piezoelectric/electrostrictive body represented by the composition formula $ABO_3$ as described above is used as the mother material, and the piezoelectric/electrostrictive body represented by the composition formula $ABO_3$ and having a residual strain during polarization which is larger than that of the mother material is added as the additive material to manufacture the piezoelectric/electrostrictive body. In consequence, the strain ratio of the piezoelectric/electrostrictive body can be increased.

Figure 1:
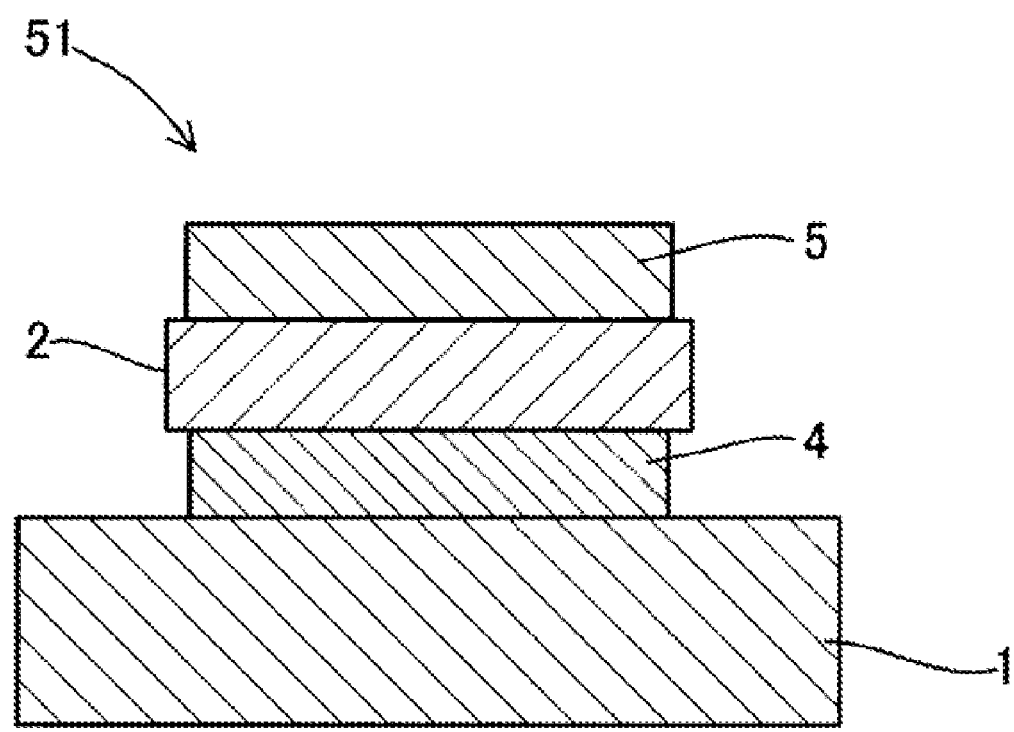
FIG. 1 is a sectional view schematically showing one embodiment of a piezoelectric/electrostrictive element of the present invention.

Next, an embodiment in which the piezoelectric/electrostrictive portion is formed into a film-like shape is shown in FIG. 1. As shown in FIG. 1, a piezoelectric/electrostrictive element 51 of the present embodiment includes a substrate 1 constituted of a ceramic material, a film-like piezoelectric/electrostrictive portion 2, and film-like electrodes 4, 5 electrically connected to this piezoelectric/electrostrictive portion 2, and the piezoelectric/electrostrictive portion 2 is secured to the substrate 1 in a state in which the electrode 4 is interposed. It is to be noted that the piezoelectric/electrostrictive portion may directly be secured to the substrate without interposing any electrode. It is to be noted that the "securing" mentioned in the present specification is a state in which any organic or inorganic adhesive is not used and in which the first piezoelectric portion 2 causes solid phase reaction with respect to the substrate 1 or the electrode 4 to closely integrate both of them.

In the piezoelectric/electrostrictive element 51 of the present embodiment (see FIG. 1), the piezoelectric/electrostrictive portion 2 has a thickness of preferably 0.5 to 50 μm, further preferably 0.8 to 40 μm, especially preferably 1.0 to 30 μm. When the piezoelectric/electrostrictive portion 2 has a thickness less than 0.5 μm, the piezoelectric/electrostrictive portion is sometimes insufficiently densified. On the other hand, when the piezoelectric/electrostrictive portion 2 has a thickness in excess of 50 μm, the contraction stress of the piezoelectric/electrostrictive body during the firing increases, the substrate 1 needs to be thickened to prevent the substrate 1 from being broken, and it sometimes becomes difficult to cope with the miniaturization of the element. It is to be noted that the piezoelectric/electrostrictive element 51 may be constituted as a so-called multilayered type.

The substrate 1 constituting the piezoelectric/electrostrictive element 51 of the embodiment of the present invention is constituted of a ceramic material, but there is not any special restriction on the type of this ceramic material. From the viewpoints of thermal resistance, chemical stability and insulation properties, the ceramic material preferably contains at least one selected from the group consisting of stabilized zirconium oxide, aluminum oxide, magnesium oxide, mullite, aluminum nitride, silicon nitride and glass.

It is to be noted that the substrate has a thickness of preferably 1 μm to 1 mm, further preferably 1.5 to 500 μm, especially preferably 2 to 200 μm. When the thickness of the substrate is less than 1 μm, the mechanical strength of the piezoelectric/electrostrictive element sometimes lowers. On the other hand, when the thickness exceeds 1 mm and the electric field is applied to the piezoelectric/electrostrictive portion, the rigidity of the substrate against the generated contraction stress increases, and the flexure displacement of the piezoelectric/electrostrictive portion sometimes decreases.

In the piezoelectric/electrostrictive element of the present embodiment, the electrode is electrically connected to the piezoelectric/electrostrictive portion, and arranged between the piezoelectric/electrostrictive portions. Examples of the material of the electrode include at least one metal selected from the group consisting of Pt, Pd, Rh, Au, Ag and an alloy of them. Above all, platinum or an alloy containing platinum as a main component is preferable in that this material has a high thermal resistance during the firing of the piezoelectric/electrostrictive portion. Moreover, since the piezoelectric/electrostrictive portion can be formed at a lower firing temperature, an alloy such as Ag—Pd may preferably be used.

EXAMPLES

The present invention will hereinafter be described in more detail in accordance with examples, but the present invention is not limited to these examples.

Example 1

The material powder of a mother material and an additive material was prepared by a usual solid phase process. As starting materials, lithium carbonate ($Li_2CO_3$), sodium tartrate ($C_4H_5O_6Na.H_2O$), potassium tartrate ($C_4H_5O_6K$), niobium oxide ($Nb_2O_5$), tantalum oxide ($Ta_2O_5$) and manganese carbonate ($MnCO_3$) were weighed so as to obtain compositions. The materials were mixed in alcohol by use of a ball mill for 16 hours, and the resultant mixture was dried, and then calcined at a temperature of 800° C. Next, the mixture was crushed and calcined again. After coarsely crushing the mixture, particle sizes were adjusted. At this time, the mother material powder had an average particle diameter of 0.4 to 0.5 μm, and the additive material powder had an average particle diameter of 0.4 to 0.5 μm. The additive material powder was subjected to grain growth at a temperature of 1000° C., and then coarsely crushed to obtain an average particle diameter of 1 to 2 μm by a classifier.

Thus, the mother material powder was formed into an alkali-niobate-based ferroelectric substance so that a composition was represented by a composition formula $\{Li_{0.060}(Na_{0.55}K_{0.45})_{0.94}\}_{1.011}(Nb_{0.918}Ta_{0.082})O_3$.

Moreover, the additive material powder was formed so that a composition (Nb of the mother material was replaced with Mn) was represented by a composition formula $\{Li_{0.060}(Na_{0.55}K_{0.45})_{0.94}\}_{1.011}(Nb_{0.916}Ta_{0.082}Mn_{0.002})O_3$.

Then, 10 to 50 vol % of the additive material was added to the mother material powder, and subjected to dry-mixing, to form a disc having a diameter of 15 mm and a thickness of about 10 mm. The formed article was fired at a temperature of 950 to 1030° C. The resultant sintered article was processed into a size of 12 mm×3 mm×1 mm, and thermally treated at 900° C.

It is to be noted that a sample of a composition of the mother material only and a sample of a composition of the additive material only were prepared, respectively. The strains of the non-polarized samples were measured to measure residual strains. The mother material had a residual strain of about 50 to 150 ppm, whereas the additive material had a residual strain of about 500 to 600 ppm. The residual strain of the additive material was larger than that of the mother material.

(Evaluation)

To evaluate a crystal phase before a polarization treatment, the sample was set so that the 12 mm×3 mm surface of the processed sample was irradiated with an X-ray, and the X-ray diffraction pattern of the sample was measured in a range of 20 to 60° by a 2θ/θ process. To diffract the X-ray, an X-ray diffraction device was used, a Cu—Kα ray was used as a radiation source, and a graphite monochromatic meter was installed before a detector. The pattern was measured on the X-ray generation conditions of 35 kV-30 mA, a scanning width of 0.02°, a scanning speed of 2°/minute, a divergence slit of 1° and a light receiving slit of 0.3 mm, and it was confirmed that two peaks having a large intensity were present in a range of 2θ=44° to 47°. At this time, it can definitely be said that when the peak intensity on a high angle side is about twice that on a low angle side, a crystal phase is mainly a tetragonal system, that is, the peak on the low angle side is a (002) face and the peak on the high angle side is a (200) face.

Next, the 12 mm×3 mm surfaces (both surfaces) of the sample was subjected to Au sputtering, and a voltage of 5 kV/mm was applied for 15 minutes to perform the polarization treatment. Then, in the same manner as described above, the sample was set so that the Au sputtered surface was irradiated with the X-ray, and the surface was irradiated with the X-ray to obtain the X-ray diffraction pattern. As to crystal orientation properties, as a surface index is of low order (I is small), the incoming depth of the X-ray decreases. Therefore, the patterns are preferably compared using the surface index of the order which is as high as possible. However, when the index is larger than a secondary order (I=2), diffraction intensity weakens. Therefore, a secondary peak was evaluated. In this case, three peaks having large intensity are present in a range of 2θ=44 to 47°, but the peak on the lowest angle side (the peak present in the range of 2θ=44 to 45° and having small intensity) is a peak due to sputtered Au. The X-ray diffraction patterns of the samples containing 20, 40 and 50 vol % of the additive material are shown in FIGS. 2, 3 and 4.

Figure 2:
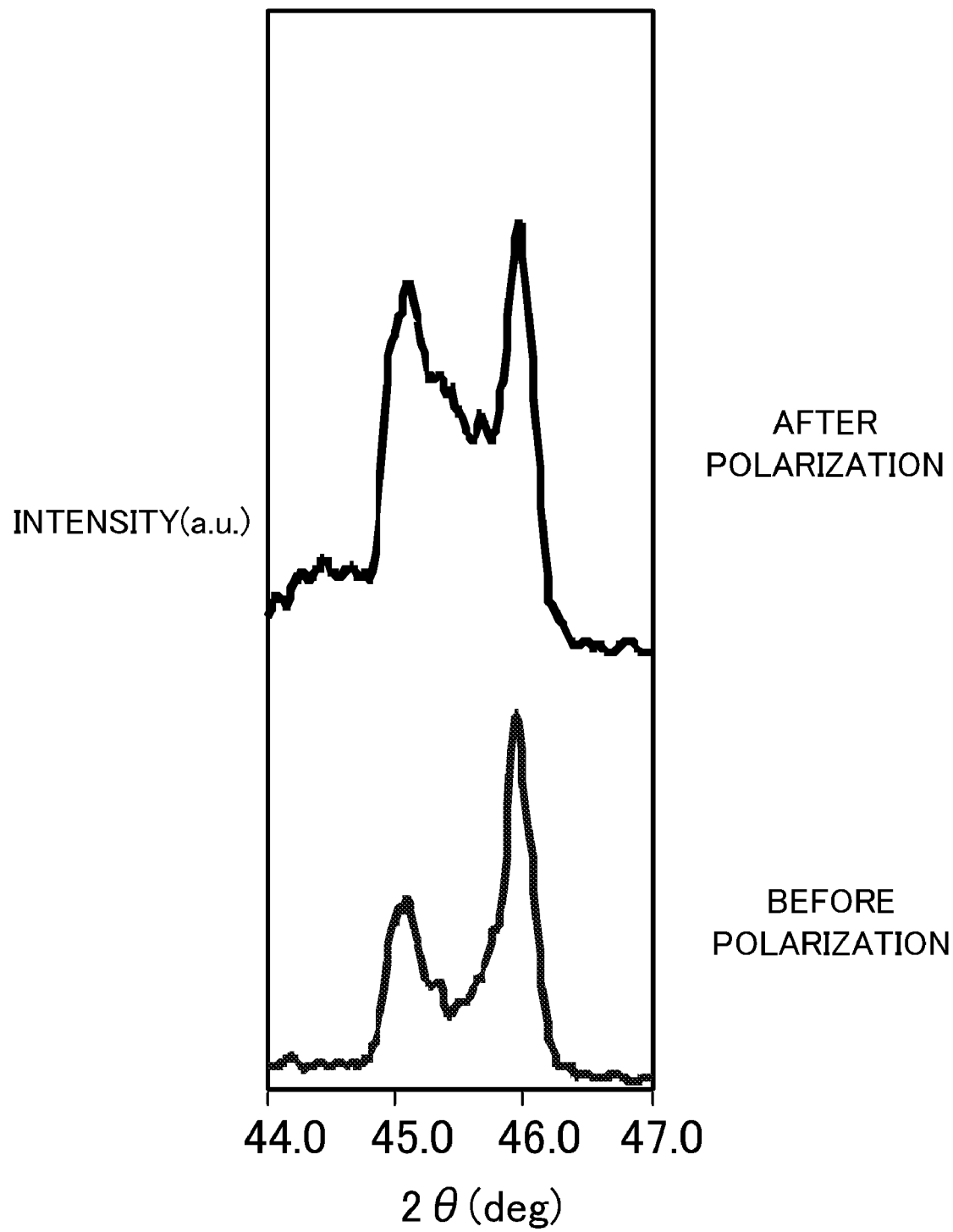
FIG. 2 is a diagram showing an X-ray diffraction pattern of a piezoelectric/electrostrictive body containing 20 vol % of an additive material.
Figure 3:
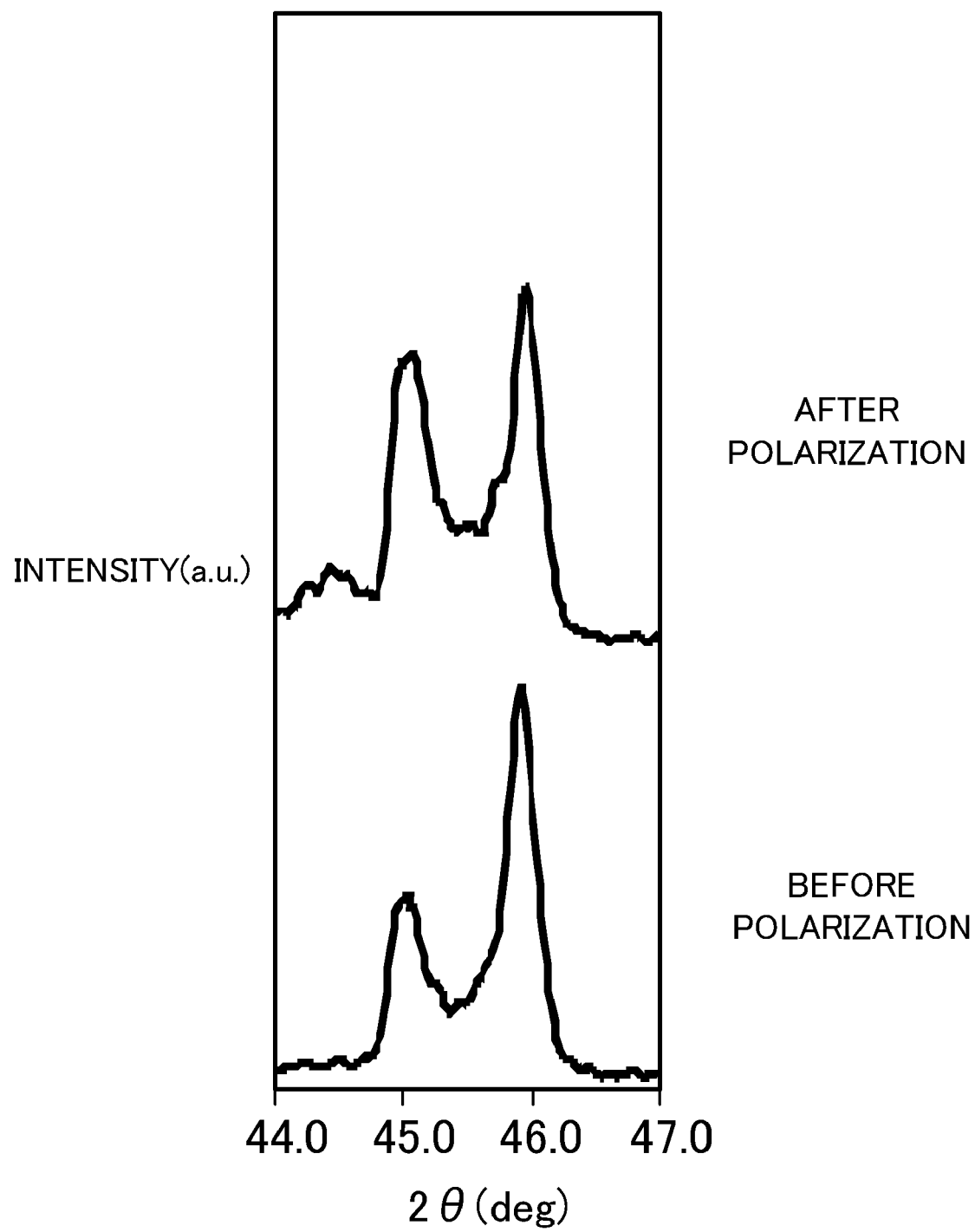
FIG. 3 is a diagram showing the X-ray diffraction pattern of the piezoelectric/electrostrictive body containing 40 vol % of the additive material.
Figure 4:
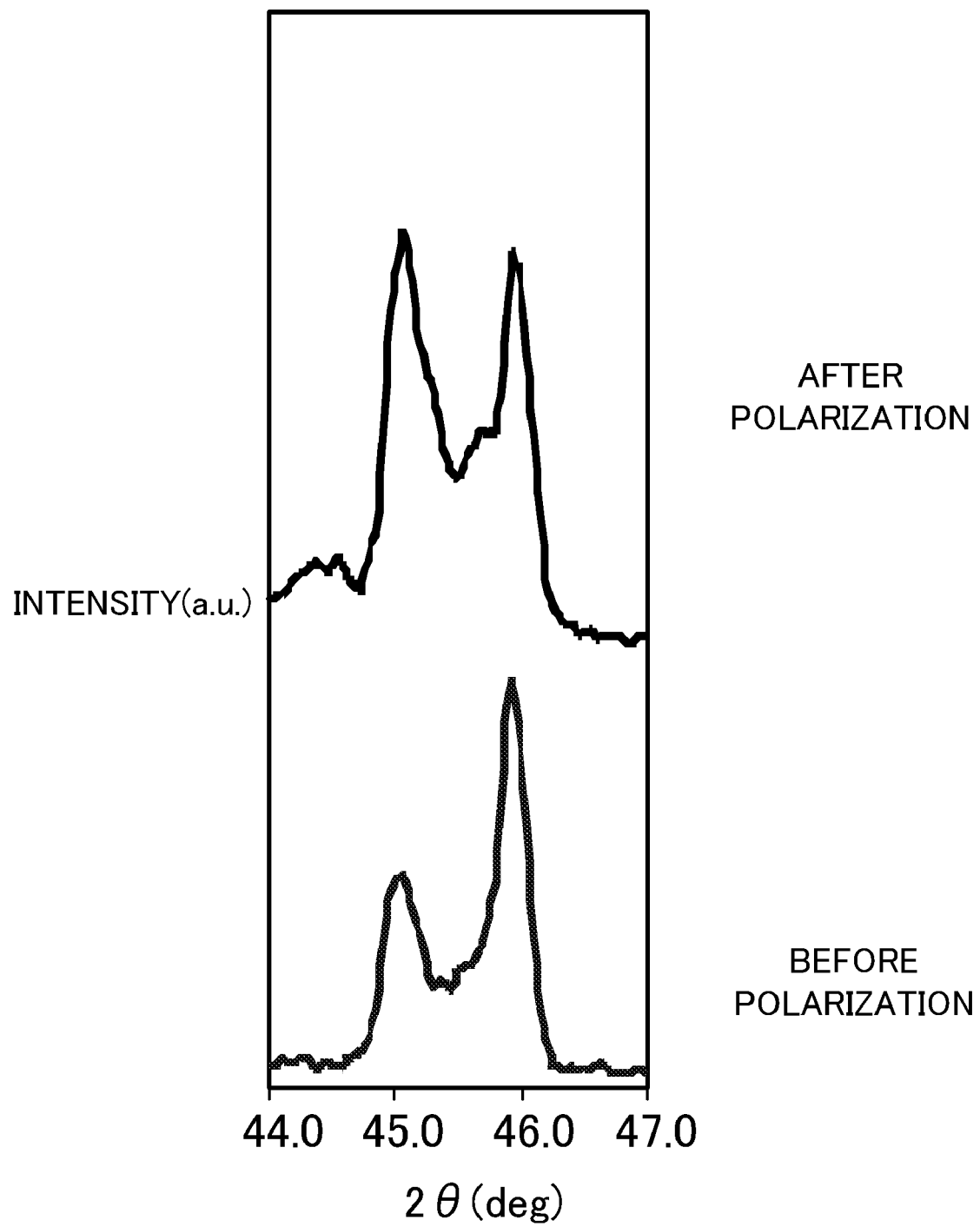
FIG. 4 is a diagram showing the X-ray diffraction pattern of the piezoelectric/electrostrictive body containing 50 vol % of the additive material.

As shown in FIGS. 2 to 4, in a tetragonal-system piezoelectric/electrostrictive body including a mother phase which was a tetragonal system represented by a composition formula $ABO_3$ and an additive material phase of a composition different from that of the mother phase represented by the composition formula $ABO_3$, the peak intensity of the (002) face in the surface of the sample (a plane vertical to the applying direction of the electric field applied so as to perform the polarization treatment) was smaller than that of the (200) face even after the polarization treatment. That is, the orientation degree of the (002) face after the polarization treatment was smaller than that of the (200) face.

Figure 6:
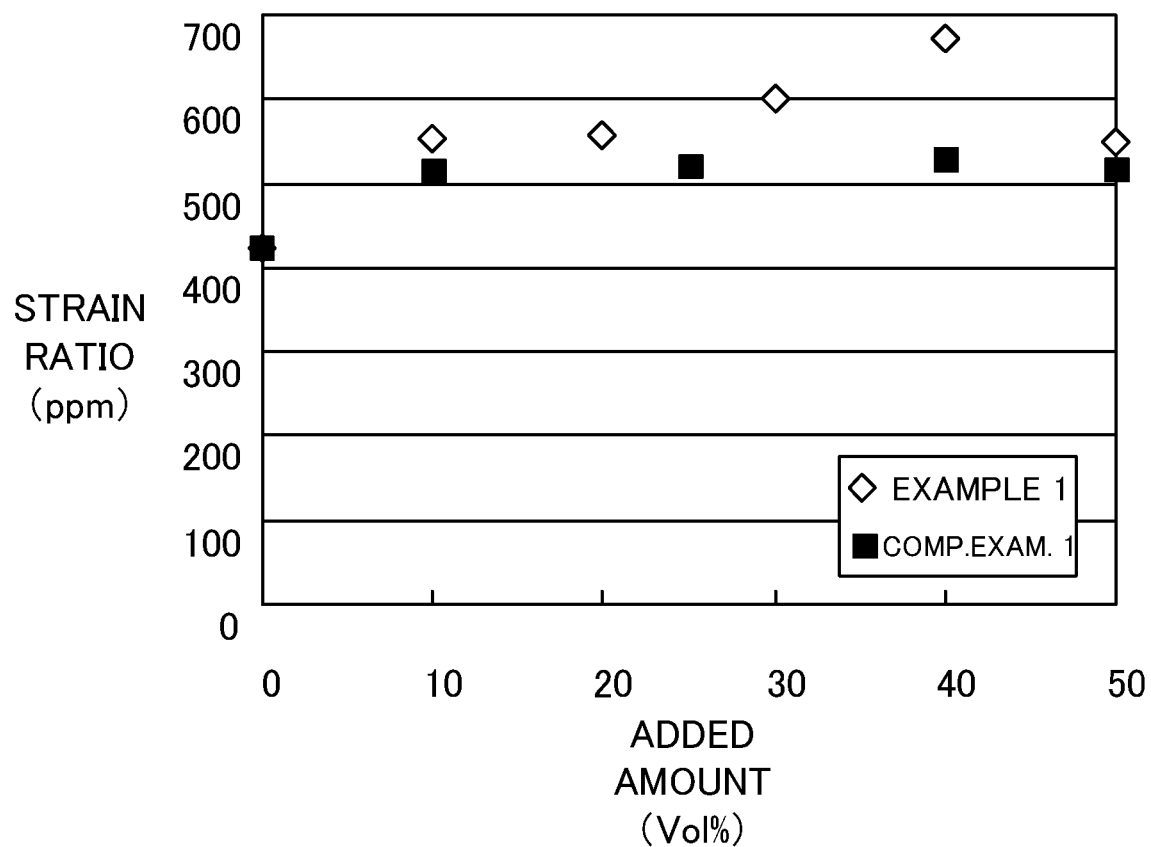
FIG. 6 is a diagram showing a relation between the amount of the additive material to be added and a strain ratio in Example 1 and Comparative Example 1.

Afterward, a strain gauge was attached to one surface with an adhesive, and a voltage of 4 kV/mm was applied to measure a strain ratio (ppm). A residual strain was obtained by measuring the strain of the non-polarized sample. The strain ratio of the sample of Example 1 during the applying of 4 kV/mm is shown in Table 1 and FIG. 6.

Comparative Example 1

Figure 5:
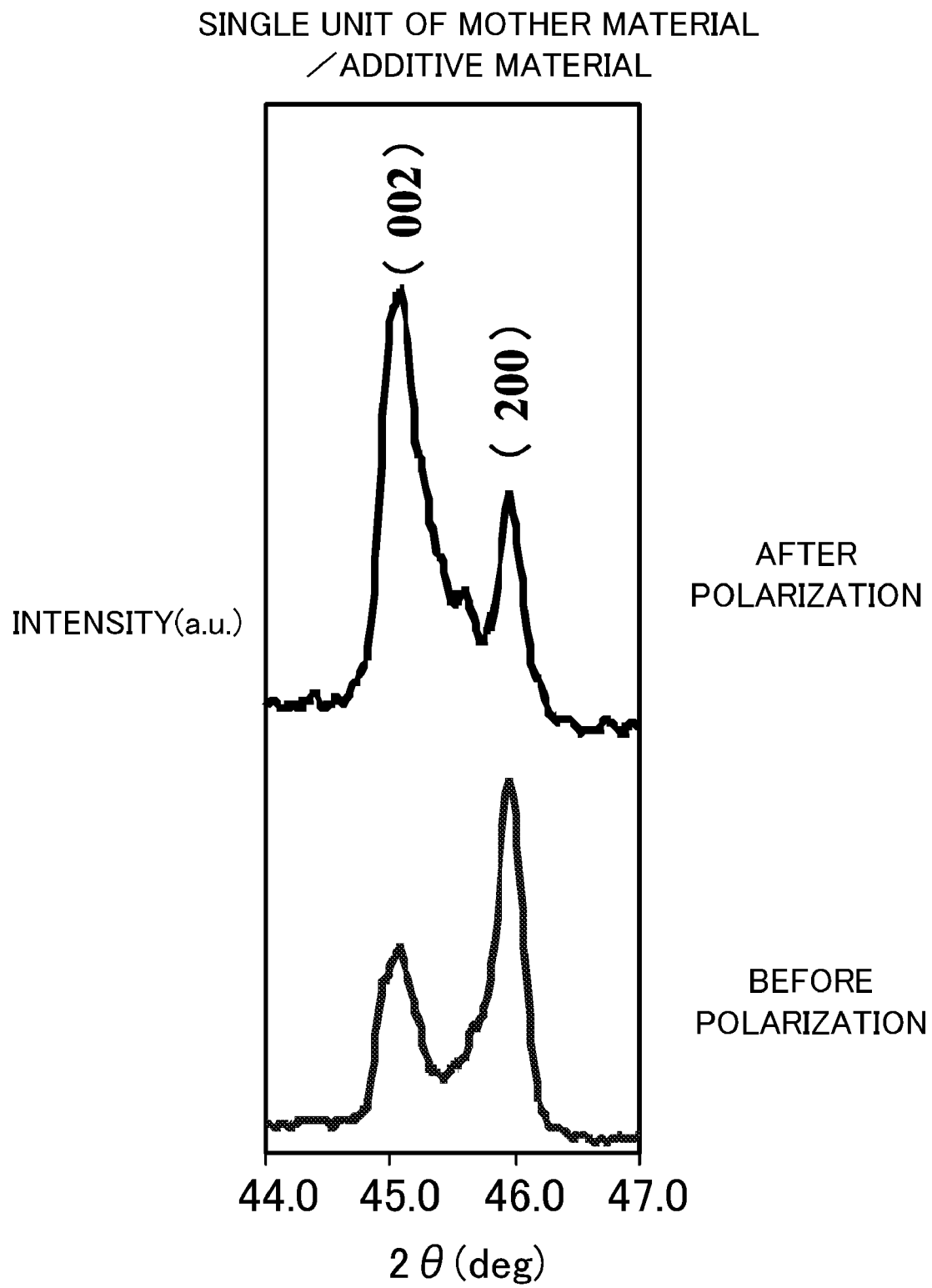
FIG. 5 is a diagram showing the X-ray diffraction pattern of the piezoelectric/electrostrictive body of a single unit of a mother material/an additive material.

In Comparative Example 1, a sample was prepared in the same manner as in Example 1 except that an additive material having an average particle diameter of 0.4 to 0.5 μm was mixed. The X-ray diffraction pattern of the sample containing 40 vol % of the additive material of Comparative Example 1 is shown in FIG. 5. From the X-ray diffraction pattern of a single unit of a mother material/the additive material shown in FIG. 5, in Comparative Example 1, the peak intensity of a (002) face after a polarization treatment was larger than that of a (200) face, in a direction vertical to the surface of the sample. That is, after the polarization treatment, the peak intensity of the (002) face increased, and the orientation degree of the (002) face increased. It is to be noted that FIG. 5 shows a sample containing 40 vol % of the additive material. However, even when the added amount varied, a similar tendency was indicated.

Afterward, in the same manner as in Example 1, a strain gauge was attached to one surface with an adhesive, and a voltage of 4 kV/mm was applied to measure a strain ratio (ppm). The strain ratio of the sample of Comparative Example 1 during the applying of 4 kV/mm is shown in Table 1 and FIG. 6.

TABLE 1

| Added Amount (vol %) | Strain Ratio (ppm) | |
|---|---|---|
| | Example 1 | Comparative Example 1 |
| 0 | 425 | 425 |
| 10 | 555 | 520 |
| 20 | 557 | — |
| 25 | — | 523 |
| 30 | 600 | — |
| 40 | 672 | 530 |
| 50 | 550 | 517 |

In Example 1, the piezoelectric/electrostrictive body including the additive material of the composition different from that of the mother phase (the crystalline phase of the additive material was the same as that of the mother material) indicated a large strain ratio in comparison with Comparative Example 1 having a uniform composition. Especially, when the additive material had a mixed amount of 40 vol %, the strain ratio became the maximum.

Example 2

A sample was prepared so that a mother phase of an Mn added composition was combined with an additive material phase of an Mn added composition and Bi replacing composition. As to Li, Na, K, Nb and Ta, a material similar to that of Example 1 was used. As Bi, bismuth oxide ($Bi_2O_3$) was used. In the case of the Mn added composition, as Mn, manganese dioxide ($MnO_2$) was used. In the same manner as in Example 1, the materials excluding $MnO_2$ were weighed, mixed and calcined. After the second calcining, $MnO_2$ was added, and the materials were coarsely crushed to adjust particle sizes. At this time, mother material powder had an average particle diameter of 0.4 to 0.5 μm, and additive material powder also had an average particle diameter of 0.4 to 0.5 μm. The additive material powder was subjected to grain growth at a temperature of 1000° C., and then the material was coarsely crushed to obtain an average particle diameter of 1 to 2 μm by a classifier.

Thus, the mother material powder was formed so that a composition was represented by $\{Li_{0.06}(Na_{0.55}K_{0.45})_{0.94}\}_{1.01}(Nb_{0.918}Ta_{0.082})O_3 + 0.02$ mol % $MnO_2$.

Moreover, the additive material powder was formed so that a composition was represented by $[\{Li_{0.06}(Na_{0.55}K_{0.45})_{0.94}\}_{0.9995}Bi_{0.0005}]_{1.01}Nb_{0.918}Ta_{0.082})O_3 + 0.02$ mol % $MnO_2$.

Afterward, a sample was prepared and evaluated in the same manner as in Example 1. Results are shown in Table 2.

TABLE 2

| Added Amount (vol %) | Strain Ratio (ppm) Example 2 |
| --- | --- |
| 0 | 520 |
| 20 | 650 |
| 40 | 730 |
| 50 | 610 |

As the result of the X-ray diffraction, in the same manner as in Example 1, even after the polarization treatment, the peak intensity of the (002) face was smaller than that of the (200) face. That is, the orientation degree of the (002) face after the polarization treatment was smaller than that of the (200) face.

As described above, when the piezoelectric/electrostrictive body of the tetragonal system represented by the composition formula $ABO_3$ is manufactured and subjected to the polarization treatment, a ratio between a diffraction peak intensity $I_{001}$ of a (001) face and a diffraction peak intensity $I_{100}$ of a (100) face can be $I_{001}/I_{100} \leq 1$, in the X-ray diffraction pattern in the plane vertical to the applying direction of the electric field after the polarization treatment. In other words, the piezoelectric/electrostrictive body can be obtained so that the orientation degree of the (001) face after the polarization treatment is smaller than that of the (100) face in the plane vertical to the applying direction of the electric field applied so as to perform the polarization treatment. Thus, in a case where the piezoelectric/electrostrictive body is manufactured so that the orientation degree of the (001) face is smaller than that of the (100) face, the strain ratio of the piezoelectric/electrostrictive body can be increased. Further specifically, when the piezoelectric/electrostrictive body including the mother phase and the additive material phase having a large residual strain and being different from the mother phase is manufactured, the strain ratio increases. In particular, the piezoelectric/electrostrictive body may be constituted so that the additive material has a volume ratio of 5 vol % or more and 45 vol % or less with respect to the mother material. In Comparative Example 1 in which the average particle diameter of the additive material powder is at the same level as that of the mother material powder, the strain ratio improves little as compared with Example 1. Therefore, a reason for the improvement of the strain ratio is supposedly as follows.

When the non-180° domains of crystals are noted, domains other than a 90° domain are present in the mother material having a composition of a tetragonal system. A uniform sintered article (the sintered article which does not have the mother phase and the additive material phase) formed by mixing the mother material powder and the additive material powder having an average particle diameter at the same level as that of the mother material powder is subjected to the polarization treatment (the applying of the electric field). In this case, the sintered article vertically contracts and horizontally expands with respect to an electric field applying direction. When the electric field is removed, the 90° domain has weak reversibility (strong irreversibility) and hence does not return. On the other hand, when the sintered article including the additive material phase having a large residual strain is subjected to the polarization treatment, a vertical tensile residual stress and a horizontal compressive residual stress remain in the mother phase with respect to the electric field applying direction, because the residual strain of the additive material is larger than that of the mother phase. Owing to this residual stress, a part of the 90° domain present in the mother phase returns. That is, it is supposed that reversibility increases, and the strain amount therefore increases.

To increase the residual stress, the additive material having a large residual strain (the additive material having a large amount of strongly irreversible 90° domains) is preferably selected. When the amount of the additive material to be mixed is smaller than 5 vol %, the residual stress decreases, the 90° domain in the mother material does not become reversible, and the strain amount hardly changes. However, it is supposed that when the mixed amount is larger than 45 vol %, the strain ratio is noticeably influenced by the additive material having the strongly irreversible 90° domain, and the strain ratio decreases (as compared with a uniform sintered article).

Moreover, the coarsely crushed additive material powder may be mixed with the mother material powder so that the additive material is not reacted with (is not dissolved in) the mother material and the additive material phase is present in the mother phase. In this case, the additive material powder preferably has an average particle diameter of 0.5 μm or more and 10 μm or less. In a case where the average particle diameter of the mother material powder is at the same level as that of the additive material powder and the powder is mixed and sintered, the materials are sintered using a hot press process or a spark plasma sintering (SPS) process while suppressing grain growth without any limit. In consequence, the piezoelectric/electrostrictive body including the mother phase and the additive material phase different from the mother phase can be obtained.

A piezoelectric/electrostrictive body and a piezoelectric/electrostrictive element according to the present invention have excellent piezoelectric/electrostrictive characteristics, and are suitable for an actuator, a sensor and the like.

What is claimed is:

1. A piezoelectric/electrostrictive body which is represented by a composition formula $ABO_3$, wherein A includes one or more elements selected from the group consisting of at least Li, Na and K, and B includes one or more elements selected from the group consisting of at least Nb, Ta, Sb and Mn, and which has a main phase of a tetragonal system,
wherein the orientation degree of a (001) face after a polarization treatment is smaller than that of a (100) face, in a plane vertical to the applying direction of an electric field applied so as to perform the polarization treatment.

2. The piezoelectric/electrostrictive body according to claim 1, wherein a ratio between a diffraction peak intensity $I_{001}$ of the (001) face and a diffraction peak intensity $I_{100}$ of the (100) face is $I_{001}/I_{100} \leq 1$, in an X-ray diffraction pattern in the plane vertical to the applying direction of the electric field after the polarization treatment.

3. The piezoelectric/electrostrictive body according to claim 1, wherein the piezoelectric/electrostrictive body represented by the composition formula $ABO_3$ includes a mother phase and an additive material phase having a composition different from that of the mother phase.

4. The piezoelectric/electrostrictive body according to claim 3, wherein the mother phase is represented by a composition formula:

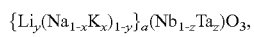

in which $0.90 \leq a \leq 1.20$, $0.20 \leq x \leq 0.80$, $0.02 \leq y \leq 0.20$ and $0.05 \leq z \leq 0.50$.

5. The piezoelectric/electrostrictive body according to claim 4, wherein the additive material phase is represented by a composition formula:

in which $0.90 \leq a \leq 1.20$, $0.20 \leq x \leq 0.80$, $0.02 \leq y \leq 0.20$, $0.05 \leq z \leq 0.50$ and $0 \leq w \leq 0.03$.

6. The piezoelectric/electrostrictive body according to claim 3, wherein the additive material phase is represented by a composition formula:

$$\{Li_y(Na_{1-x}K_x)_{1-y}\}_a(Nb_{1-z-w}Ta_zMn_w)O_3,$$

in which $0.90 \leq a \leq 1.20$, $0.20 \leq x \leq 0.80$, $0.02 \leq y \leq 0.20$, $0.05 \leq z \leq 0.50$ and $0 \leq w \leq 0.03$.

7. The piezoelectric/electrostrictive body according to claim 3, wherein the mother phase is represented by a composition formula:

$$\{Li_y(Na_{1-x}K_x)_{1-y}\}_a(Nb_{1-z}Ta_z)O_3 + nMn \text{ compound},$$

in which $0.90 \leq a \leq 1.20$, $0.20 \leq x \leq 0.80$, $0.02 \leq y \leq 0.20$, $0.05 \leq z \leq 0.50$ and n is 3 molar parts or less in terms of an Mn atom.

8. The piezoelectric/electrostrictive body according to claim 7, wherein the additive material phase is represented by a composition formula:

$$[\{Li_y(Na_{1-x}K_x)_{1-y}\}_{1-t}Bi_t]_a(Nb_{1-z}Ta_z)O_3 + nMn \text{ compound},$$

in which $0.90 \leq a \leq 1.20$, $0.20 \leq x \leq 0.80$, $0.02 \leq y \leq 0.20$, $0.05 \leq z \leq 0.50$, $0 \leq t \leq 0.002$ and n is 3 molar parts or less in terms of an Mn atom.

9. The piezoelectric/electrostrictive body according to claim 3, wherein the additive material phase is represented by a composition formula:

$$[\{Li_y(Na_{1-x}K_x)_{1-y}\}_{1-t}Bi_t]_a(Nb_{1-z}Ta_z)O_3 + nMn \text{ compound},$$

in which $0.90 \leq a \leq 1.20$, $0.20 \leq x \leq 0.80$, $0.02 \leq y \leq 0.20$, $0.05 \leq z \leq 0.50$, $0 \leq t \leq 0.002$ and n is 3 molar parts or less in terms of an Mn atom.

10. A piezoelectric/electrostrictive element which comprises:
a piezoelectric/electrostrictive body which is represented by a composition formula $ABO_3$, wherein A includes one or more elements selected from the group consisting of at least Li, Na and K, and B includes one or more elements selected from the group consisting of at least Nb, Ta, Sb and Mn, and which has a main phase of a tetragonal system,
wherein the orientation degree of a (001) face after a polarization treatment is smaller than that of a (100) face, in a plane vertical to the applying direction of an electric field applied so as to perform the polarization treatment; and
an electrode portion provided in the piezoelectric/electrostrictive body.

11. A piezoelectric/electrostrictive element according to claim 10, wherein a ratio between a diffraction peak intensity $I_{001}$ of the (001) face and a diffraction peak intensity $I_{100}$ of the (100) face is $I_{001}/I_{100} \leq 1$, in an X-ray diffraction pattern in the plane vertical to the applying direction of the electric field after the polarization treatment.

12. A piezoelectric/electrostrictive element according to claim 10, wherein the piezoelectric/electrostrictive body represented by the composition formula $ABO_3$ includes a mother phase and an additive material phase having a composition different from that of the mother phase.

13. The piezoelectric/electrostrictive body according to claim 12, wherein the mother phase is represented by a composition formula:

$$\{Li_y(Na_{1-x}K_x)_{1-y}\}_a(Nb_{1-z}Ta_z)O_3,$$

in which $0.90 \leq a \leq 1.20$, $0.20 \leq x \leq 0.80$, $0.02 \leq y \leq 0.20$ and $0.05 \leq z \leq 0.50$.

14. The piezoelectric/electrostrictive body according to claim 13, wherein the additive material phase is represented by a composition formula:

$$\{Li_y(Na_{1-x}K_x)_{1-y}\}_a(Nb_{1-z-w}Ta_zMn_w)O_3,$$

in which $0.90 \leq a \leq 1.20$, $0.20 \leq x \leq 0.80$, $0.02 \leq y \leq 0.20$, $0.05 \leq z \leq 0.50$ and $0 \leq w \leq 0.03$.

15. The piezoelectric/electrostrictive body according to claim 12, wherein the additive material phase is represented by a composition formula:

$$\{Li_y(Na_{1-x}K_x)_{1-y}\}_a(Nb_{1-z-w}Ta_zMn_w)O_3,$$

in which $0.90 \leq a \leq 1.20$, $0.20 \leq x \leq 0.80$, $0.02 \leq y \leq 0.20$, $0.05 \leq z \leq 0.50$ and $0 \leq w \leq 0.03$.

16. The piezoelectric/electrostrictive body according to claim 12, wherein the mother phase is represented by a composition formula:

$$\{Li_y(Na_{1-x}K_x)_{1-y}\}_a(Nb_{1-z}Ta_z)O_3 + nMn \text{ compound},$$

in which $0.90 \leq a \leq 1.20$, $0.20 \leq x \leq 0.80$, $0.02 \leq y \leq 0.20$, $0.05 \leq z \leq 0.50$ and n is 3 molar parts or less in terms of an Mn atom.

17. The piezoelectric/electrostrictive body according to claim 16, wherein the additive material phase is represented by a composition formula:

$$[\{Li_y(Na_{1-x}K_x)_{1-y}\}_{1-t}Bi_t]_a(Nb_{1-z}Ta_z)O_3 + nMn \text{ compound},$$

in which $0.90 \leq a \leq 1.20$, $0.20 \leq x \leq 0.80$, $0.02 \leq y \leq 0.20$, $0.05 \leq z \leq 0.50$, $0 \leq t \leq 0.002$ and n is 3 molar parts or less in terms of an Mn atom.

18. The piezoelectric/electrostrictive body according to claim 12, wherein the additive material phase is represented by a composition formula:

$$[\{Li_y(Na_{1-x}K_x)_{1-y}\}_{1-t}Bi_t]_a(Nb_{1-z}Ta_z)O_3 + nMn \text{ compound},$$

in which $0.90 \leq a \leq 1.20$, $0.20 \leq x \leq 0.80$, $0.02 \leq y \leq 0.20$, $0.05 \leq z \leq 0.50$, $0 \leq t \leq 0.002$ and n is 3 molar parts or less in terms of an Mn atom.

* * * * *